Figure 1:
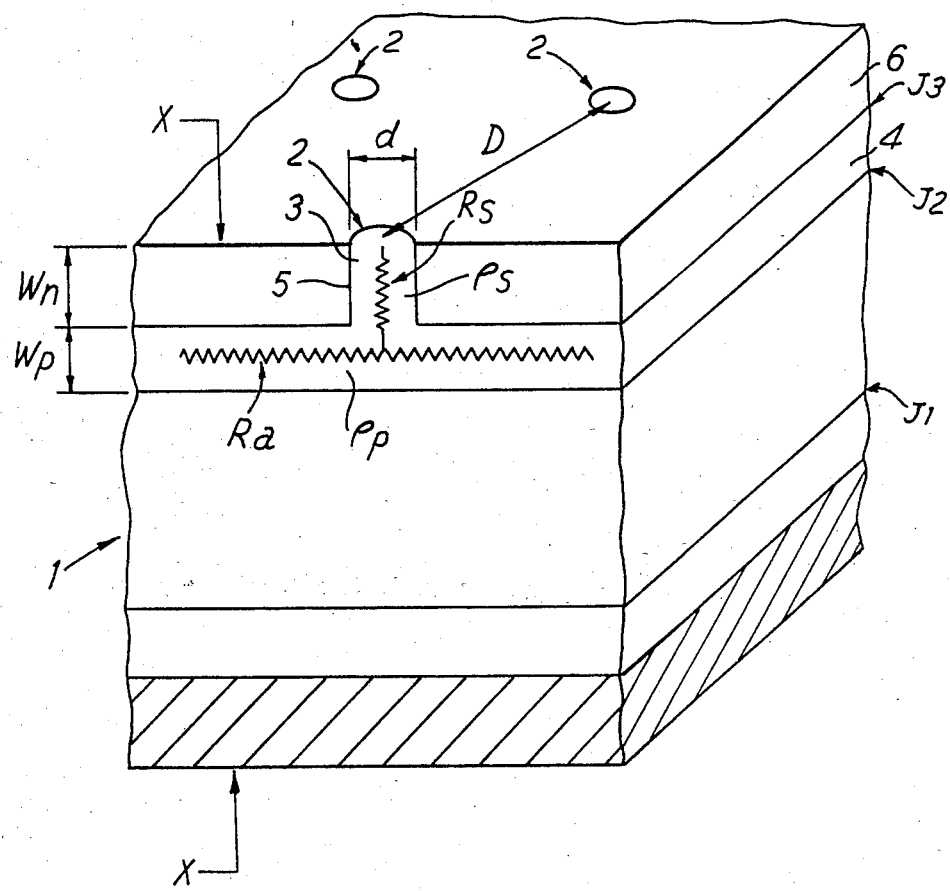

United States Patent [19]
Garrett

[11] Patent Number: 4,605,451
[45] Date of Patent: Aug. 12, 1986

[54] PROCESS FOR MAKING THYRISTOR DEVICES
[75] Inventor: John M. Garrett, Chippenham, England
[73] Assignee: Westinghouse Brake and Signal Company Limited, United Kingdom
[21] Appl. No.: 638,812
[22] Filed: Aug. 8, 1984
[51] Int. Cl.⁴ .......................................... H01L 21/383
[52] U.S. Cl. .................................... 148/191; 148/190; 29/571; 357/38
[58] Field of Search .............. 148/191, 190; 357/38 P; 29/571

[56] References Cited
U.S. PATENT DOCUMENTS
3,484,309 12/1969 Gilbert ................................ 148/33.5
3,701,696 10/1972 Mets ................................ 148/191 X
4,170,502 10/1979 Watakabe ............................ 148/191

FOREIGN PATENT DOCUMENTS
972853 10/1964 United Kingdom .
1351867 5/1974 United Kingdom .

Primary Examiner—George I. Ozaki
Attorney, Agent, or Firm—Nilsson, Robbins, Dalgarn, Berliner, Carson & Wurst

[57] ABSTRACT

A governing factor of the switching characteristics of a thyristor device is base layer resistivity, for example in a gate turn-off device, to maximize load current it is preferably low but, the reverse breakdown voltage of the emitter-base junction is improved if the resistivity is high. The invention proposes a modified base layer dopant diffusion process in which the dopant diffusion process in which the dopant source is removed before completion in order that the peak of concentration is diffused-in below the surface so as to produce a graduated resistivity profile which increases nearer the surface. In shorted-emitter thyristors the surface region is masked during subsequent emitter diffusion so that the remaining short columns contain higher resistivity material.

2 Claims, 6 Drawing Figures

PROCESS FOR MAKING THYRISTOR DEVICES

The invention relates to thyristor devices, which is to be understood to include gate turn-off devices.

The invention is particularly concerned with thyristor devices produced by diffusion proceses. When an impurity is diffused into semiconductor material from one major face of a basic element the impurity concentration is greatest adjacent said major face and progressively declines with increasing depth, substantially in accordance with an error function curve.

The dynamic switching characteristics of semiconductor thyristor devices are to a great extent influenced by a single common factor in the form of the controlling base layer resistivity or conductivity affecting both turn-on and turn-off capabilities of devices.

When the conductivity regions of a semiconductor device are produced by a diffusion process resistivity is greatest at depth and decreases gradually towards the surface.

In a shorted-emitter thyristor ideally the lateral resistance of the said base layer should be low and the effective resistance between any point in the base layer and the emitter contact should be relatively higher. This is the opposite of the result of applying a normal diffusion process to the fabrication of a thyristor, so the practical approach is a compromise at which the base layer has the highest value of resistance which will permit either the desired dV/dt or the desired turn-off/turn-on performance to be achieved.

In a gate turn-off thyristor the maximum load current which can be turned off is directly related to the gate extraction current which, in turn, is limited by the resistance of the controlling base layer and the maximum usable gate voltage. Thus the resistivity of the base layer is preferably low while the gate voltage limit is determined by the reverse breakdown voltage of the emitter-base junction which is improved if the base layer resistivity is high. Again this requires a conductivity profile which is opposite to that produced in conventional diffusion processes.

The basis of the present invention involves the use of an out-diffusion step to lower the concentration of impurity levels adjacent to a major face whereby the lateral or sheet resistance of a desired layer may be controlled to the extent of favourably influencing the characteristics of the finished device. An out-diffusion step, per se, is known from GB No. 972 853 which describes limited source diffusion in the production of a germanium transistor. Germanium semiconductor techniques were generally not directly applicable to silicon device production processes because of the inherent difference between the two materials and the different dopants used and their behaviour.

GB No. 1 351 867 also described the fundamental problem of "normally graded" diffused semiconductor layers in the base region of thyristors and proposed the production of a "reverse graded" layer by epitaxial deposition. Expitaxial processes are inherently more expensive than diffusion and have a tendency to produce a laterally non-uniform layer particularly evident on the relatively large surface area elements characteristic of thyristors.

According to the present invention a method of producing a thyristor device having plurality of superimposed semiconductor layers of alternating conductivity type in which a controlling base region at least is produced by diffusing in dopant from a dopant source, such as gallium, and in said diffusion step the dopant source is removed after a time and the diffusion process subsequently continued in order to out-diffuse a surface region to provide a graduated dopant concentration profile having maximum value at a depth intermediate the controlling base region.

In a shorted-emitter thyristor device produced according to the method of the invention the dopant concentration profile has a maximum value within the base layer and decreases towards the emitter surface to provide emitter shorts having relatively higher resistivity.

In a gate turn-off thyristor device produced according to the method of the invention the dopant concentration profle has a maximum value within the controlling base layer.

Figure 2:
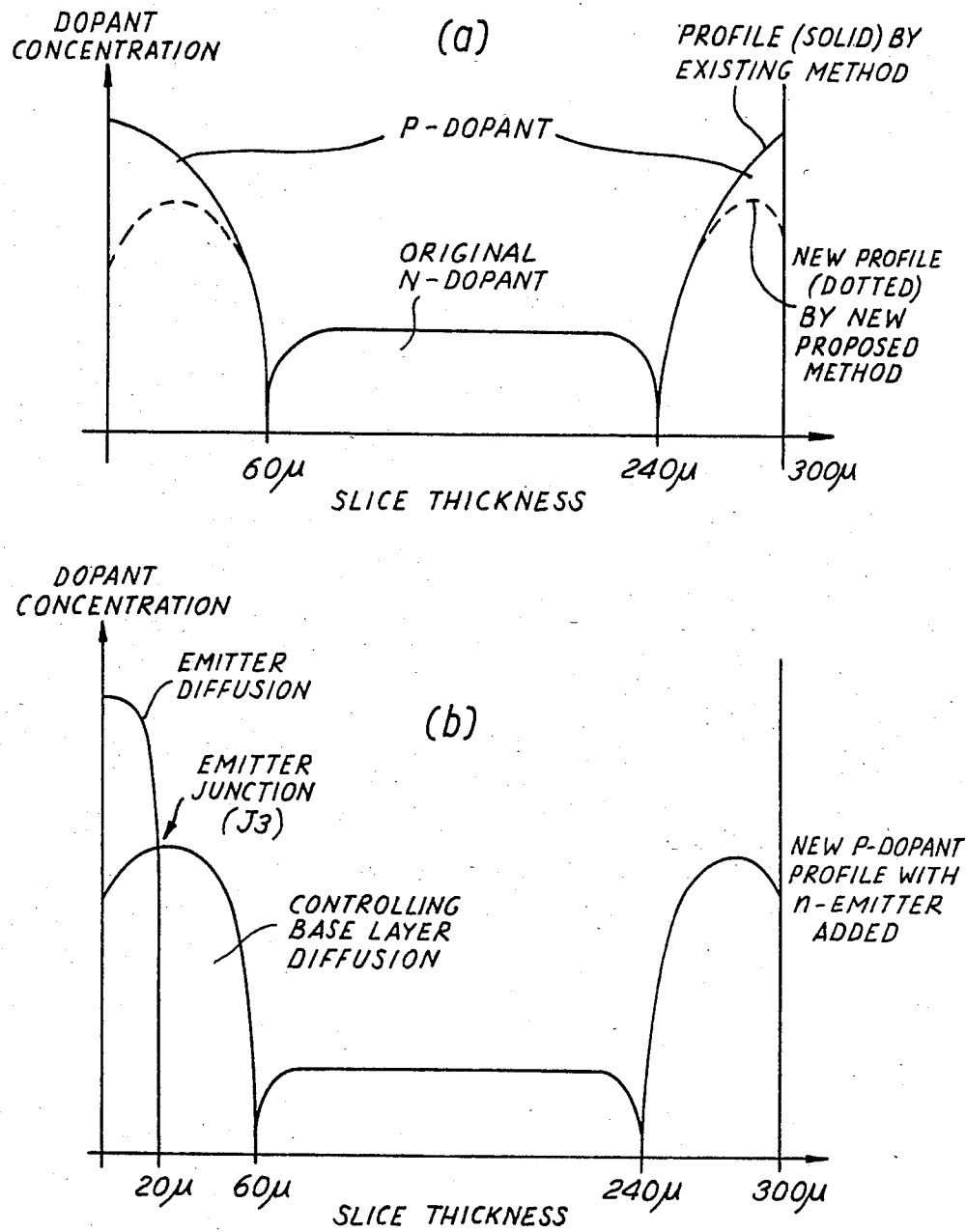
Figure 3:
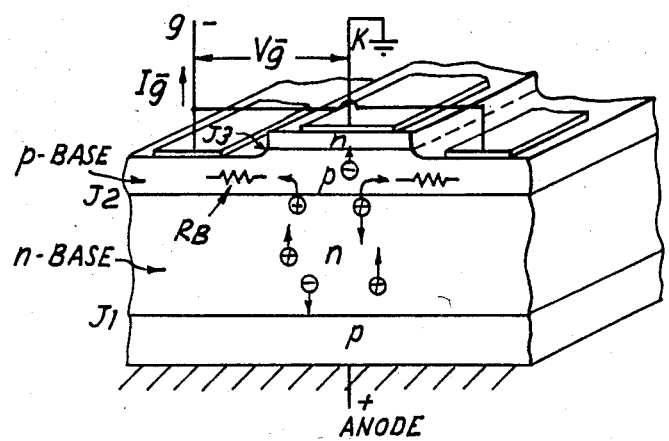
Figure 4:
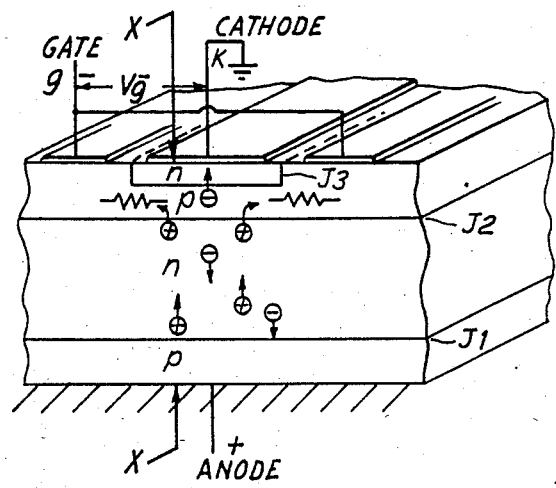
Figure 5:
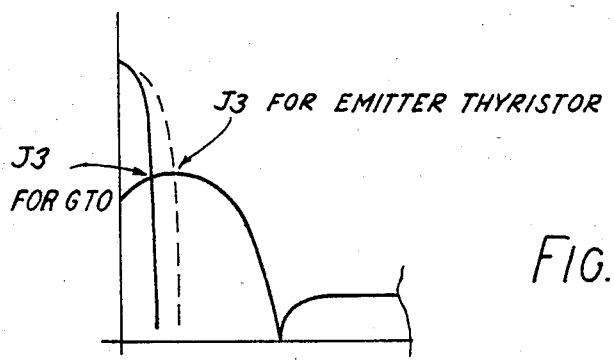

For a better understanding of the present invention and to show how it may be carried into practice, reference will now be made, by way of example only, to the accompanying drawings, in which:

FIG. 1 is a schematic illustration of a section through a shorted-emitter thyristor, FIG. 2(a) shows comparative dopant profiles for use in shorted emitter thyristors produced according to existing and proposed methods, FIG. 2(b) shows dopant concentration in a finished device according to the invention, e.g. on section X—X in FIGS. 1 and 4, FIG. 3 shows a schematic cross-section through a gate turn-off thyristor having a mesa cathode structure, FIG. 4 shows a similar cross-section through a gate turn-off thyristor having planar structure, and FIG. 5 shows the relative positions of the junctions in respect of the base layer dopant concentration profile for shorted-emitter and gate turn-off thyristors.

In a shorted-emitter thyristor in order for an emitter short to be effective, the lateral resistance in the p-base layer between any part of the emitter and the body of a short must have a sufficienty low value. On the other hand, for the conduction property not to be unduly impaired, the effective resistance between any point in the base and the emitter contact via the shortening path should have a relatively high value. Furthermore, the effective value of the lateral resistance should ideally be the same for all points in the emitter layer. Theoretically, therefore, an efficient shorted-emitter thyristor structure might be expected to possess zero p-base resistance (disregarding the effect of this on emitter injection efficiency) and a series resistance in the electrical shorting path between the p-base and the emitter electrode. In practice, this type of structure should be closely approached if the distributed p-base resistance is as low as possible and a relatively large resistance is contained within the structure of the emitter short itself.

The present invention modifies the diffusion process, by which the base layer of p-type conductivity is produced, in order to graduate the resistivity of that portion of the region later masked during n-type emitter diffusion so as to produce emitter shorts having the desired characteristics. After the p-doped layers have been formed by a conventional diffusion process there is a slight tendency, during later processing, e.g. oxide masking and emitter diffusion stages, for the surface layers of the p-base diffusion to "out-diffuse". The p-dopant evaporates from the surface of the silicon slice resulting in a thin surface layer being depleted of p-dopant but having virtually insignificant depth.

The invention results in a very much enhanced out-diffusion penetrating into the silicon slice to a much greater depth to produce a significant inverted concentration profile compared to that originally imposed to cause the normal in-diffusion. By adjustment of the periods of time of the presence and absence of a p-dopant source during this procedure and appropriate adjustment of the other parameters which affect the diffusion process the out-diffusion effect is closely controlled so as to produce a sufficiently depleted region to substantially the same depth as the subsequent n-emitter diffusion.

Referring now to the drawings, FIG. 1 shows a section through a thyristor 1 having a shorted emitter construction. The shorts 2 comprise columns 3 of p-type semiconductor material rising from the p-type base layer 4 through perforations 5 in the overlying n-type emitter layer 6. The shorts are circular in section, having diameter d, and are arranged in a regular triangular array over the whole surface of the device, with an inter-short spacing D.

It can be shown in a device of the type illustrated with the form of short configuration shown, that the effective distributed lateral base resistance is closely approximated by:

$$Ra = \rho p / 4\pi Wp [2 \ln (D/d) + (d/D)^2 - 1]$$

where
 Ra=distributed lateral base resistance at maximum inter-short distance,
 D=inter-short spacing,
 d=short diameter,
 $\rho p$=mean resistivity of p-type base layer, and
 Wp=depth of p-type base layer,
and, the short series resistance is:

$$Rs = 4\rho s Wn / \pi d^2$$

where
 Rs=emitter short series resistance,
 $\rho s$=mean resistivity of p-type material in column of the short, and
 Wn=depth of n-type emitter layer.
The total short resistance R (short) is thus the sum of these two expressions, i.e.

$$R(\text{short}) = Ra + Rs.$$

An objective of the invention can be expressed in terms of increasing the ratio Rs/Ra. The proposed method seeks to increase the value of Rs without significantly affecting the value of Ra relative to a conventional device. Although there is no absolute restriction, in theoretical terms, on the value of Rs there is every indication that a thyristor device in which Rs<<Ra would not produce an effective improvement compared to present thyristor constructions. On the other hand it is expected that improvements in performance will result generally when Rs is at least equal to Ra/10 and preferably Rs>>Ra/10.

In a thyristor constructed according to the presently proposed method the base layer lateral resistance Ra has a characteristic virtually indistinguishable from that which would be produced by conventional known methods in a similar device. For comparison FIG. 2(a) shows dopant profiles (solid line) produced by conventional or existing methods and that (dotted line) produced by the presently proposed method.

In FIG. 2(a) the p-dopant concentration profile produced by an existing conventional diffusion process is represented by the solid line and, the modified p-dopant profile resulting from the out-diffusion of the presently proposed diffusion process is shown by the dotted line. The out-diffusion effect is produced by removing the p-dopant source at a stage sufficiently early in the process to cause an enhanced surface depletion of p-type dopant in the p-type regions then being formed by permitting out-diffusion to continue for a period of time. An increase in the initial p-dopant surface concentration may be used in order to compensate for its early removal so as to produce a p-base region under the subsequent emitter diffusion region (see FIG. 2(b)) which has very similar properties, particularly in respect of injection efficiency and transport factor, relative to a conventionally produced profile. Gallium has been found to be a particularly suitable dopant as the diffusion of gallium atoms into and out of a silicon surface is not significantly impeded by the presence of surface oxides. A typical final profile of dopant concentrations including the emitter diffusion, as may be found on the section X—X in the devices of FIGS. 1 and 4, is shown in FIG. 2(b). It is to be particularly noted in the drawing that the controlling base layer has a dopant concentration peak intermediate its upper and lower depth limits, e.g. at approximately 30 microns below the emitter surface of the device. The emitter diffusion, however, extends to a lesser depth of approximately 20 microns, forming the emitter junction in the region of its lower limit.

The effective resistivity $\rho s$ of the surface region which is utilized to form the emitter shorts, which have the resistance Rs, may thus be increased by a factor of up to 10 times. For a given value of Rs, short resistance, the cross-sectional area of the short ($\pi/4 - d^2$) can be increased by a corresponding factor, yielding an increase in short diameter d of $\sqrt{10}$ times, i.e. 3.16. This obviates problems which may arise because the short diameter is too small for easy working since the present invention permits the short diameter to be increased to a more convenient size whilst enabling a desired short resistance to be achieved. For example, in a typical device having a total emitter short surface area of 2% of total emitter area the invention could permit this area to be increased to a maximum of approximately 20%. However, such a high figure is exceptional and in general terms the range of emitter short area is expected to be 5% to 12% of total cathode emitter area.

By way of further example in a typical device of the type referred to earlier in the above given equations, having a high density of small shorts, conventional design calculations provide an inter-short spacing D=300 μm, and a short diameter d=50μ. Which gives a total shorted area of 2.5% of total emitter area.

Taking the following values of
 depth of n-type layer Wn=20 μm,
 depth of p-type layer Wp=40 μm
then $$R_a = \rho p / 4\pi Wp [2 \ln (D/d) + (d/D)^2 - 1] = 52\rho p$$

and $$Rs = 4\rho s Wn / \pi d^2 = 102\rho s.$$

Therefore the ratio $Rs/Ra \simeq 2\rho s/\rho p$

In a conventional device a typical value of the resistivity ratio $\rho s/\rho p$ is approximately 0.1
so that $Rs/Ra=0.2$.

In the corresponding device constructed using the present invention the diffusion profile may be modified to provide a resistivity ratio of
$\rho s/\rho p=0.5$
so that $Rs/Ra=1$.

The diffusion profiles outlined above will be found generally satisfactory where aluminum surface contacts are applied by evaporation followed by sintering or, particularly as applied to the anode face by alloying with aluminum or an aluminum alloy. Where other forms of contact are desired, e.g., nickel plating, the surface concentration of normal p-dopant (typically Gallium) may be boosted initially with, e.g., boron in order to obtain reliable low resistance contact properties. Boron is particularly suitable as it has a low diffusion constant but a high solubility in silicon. This is not inconsistent with the present invention provided the depth of penetration of boost dopant is small compared to the depth of the out-diffused effect.

In a gate turn-off thyristor the current which can be turned off is directly related to the gate extraction current which in turn is jointly determined by two factors: Firstly, the conductance of the p-base region through which majority carriers have to be extracted to the extracting terminal, i.e. the gate terminal, and secondly, the maximum voltage Vg which can be used to effect such extraction.

As shown in FIGS. 3 and 4 the maximum voltage Vg is effectively the reverse breakdown voltage of the emitter base junction J3, which can be improved if the resistivity of the p-base layer is relatively high. In contrast, for a given emitter dimension the conductance of the p-base layer is improved by keeping its resistivity to a minimum. As previously mentioned the normal gradation of p-base resistivity as formed by conventional diffusion processes is at a maximum at the junction J2 falling to a minimum at the device surface, with the junction J3 lying generally at an intermediate resistivity. In a device as shown in FIG. 4 this junction J3 rises to the surface at the edges of the emitter where its breakdown voltage will therefore be at a minimum.

The breakdown voltage of junction J3 in device mode according to the invention is increased compared to that of a prior art device having the same average p-base resistivity under junction J3 and the product of breakdown voltage and the underlying p-base conductivity is consequently increased. Also, this obviates the penalty of the junction J3 appearing at the device surface, as in FIG. 2, since the resistivity towards the surface is now increasing as a result of which the breakdown voltage is not lowered.

Preferably the depth of the emitter diffusion to form junction J3 does not exceed the depth of the maximum diffused concentration of the p-base region. Whereas the lateral base resistance is determined by the harmonic mean value of base resistivity, the p-base resistivity operative in respect of voltage breakdown of junction J3 is determined by the minimum resistivity anywhere approaching the junction. Therefore there may be further advantage in forming the emitter base junction J3 at a shallower depth from the surface in a gate turn-off thyristor compared to an emitter-short thyristor as shown in the relative profiles of FIG. 5.

I claim:
1. In a process for producing a thyristor device having a semiconductor body comprising a plurality of superimposed layers of alternating conductivity type in which a controlling base region is produced by diffusing into a surface of said semicondutor body a p-dopant from a p-dopant source to a predetermined depth, wherein the improvement comprises:
  removing said p-dopant source; and
  continuing said diffusion process in the absence of said p-dopant source for a time sufficient to simultaneously drive said p-dopant in said body further into said body to a depth sufficient to define said controlling base layer and to out-diffuse said p-dopant in said body from said surface to provide a graduated dopant concentration profile in said controlling base region having a maximum value at approximately the midpoint of said controlling base region.
2. The improvement as defined in claim 1 which further includes the steps of introducing an n-dopant into said diffusion process and diffusing said n-dopant into said surface to approximately said maximum value point in said controlling base region to form an n-emitter.

* * * * *